US008900771B2

(12) United States Patent
Vyas et al.

(10) Patent No.: US 8,900,771 B2
(45) Date of Patent: Dec. 2, 2014

(54) NON-NOBLE METAL INEXPENSIVE CONDUCTIVE COATINGS FOR FUEL CELL BIPOLAR PLATES

(75) Inventors: Gayatri Vyas, Rochester Hills, MI (US); Mahmoud H. Abd Elhamid, Grosse Pointe Woods, MI (US); Youssef M. Mikhail, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1371 days.

(21) Appl. No.: 11/465,141

(22) Filed: Aug. 17, 2006

(65) Prior Publication Data

US 2010/0285396 A1 Nov. 11, 2010

(51) Int. Cl.
*H01M 2/38* (2006.01)
*H01M 8/02* (2006.01)
*C23C 14/06* (2006.01)
*C23C 14/35* (2006.01)

(52) U.S. Cl.
CPC ......... *H01M 8/0228* (2013.01); *C23C 14/0605* (2013.01); *C23C 14/35* (2013.01); *H01M 8/021* (2013.01); *H01M 8/0213* (2013.01); *H01M 8/0254* (2013.01); *Y02E 60/50* (2013.01)
USPC ........... 429/457; 429/456; 429/483; 429/514; 429/518; 429/535

(58) Field of Classification Search
CPC ............ H01M 8/0228; H01M 8/0234; H01M 8/0247; H01M 8/0258; H01M 8/0254; H01M 8/0245; C23C 14/0605; C23C 14/35; Y02E 60/50
USPC ............ 429/34, 38, 39, 40, 42, 44, 456, 457, 429/483, 513, 514, 517, 518, 535
See application file for complete search history.

(56) References Cited

U.S. PATENT DOCUMENTS

| 5,624,769 A | 4/1997 | Li et al. |
| 5,830,332 A * | 11/1998 | Babich et al. ............. 204/192.15 |
| 6,086,730 A * | 7/2000 | Liu et al. .................. 204/192.16 |
| 6,258,476 B1 | 7/2001 | Cipollini |
| 6,726,993 B2 * | 4/2004 | Teer et al. ..................... 428/408 |

(Continued)

FOREIGN PATENT DOCUMENTS

| DE | 112005001954 T5 | 8/2004 |
| EP | 0975040 A1 | 1/2000 |

(Continued)

OTHER PUBLICATIONS

K.V. Oskomov et al, "Properties of Nanolayerd Carbon Films Deposited by Unbalanced Magnetron Sputtering Deposition," (2004) pp. 409-412 7th International Conference on Modification of Materials with Particle Beams and Plasma Flows.

(Continued)

*Primary Examiner* — Patrick Ryan
*Assistant Examiner* — Ben Lewis
(74) *Attorney, Agent, or Firm* — BrooksGroup

(57) ABSTRACT

One embodiment of the invention includes a process including providing an electrically conductive fuel cell component having a first face, and depositing a graphitic/conductive carbon film on the first face of the electrically conductive fuel cell component comprising sputtering a graphite target using a closed field unbalanced magnetron field.

35 Claims, 5 Drawing Sheets

(56) References Cited

U.S. PATENT DOCUMENTS

| | | | |
|---|---|---|---|
| 6,733,911 | B2 | 5/2004 | Kawahara |
| 2004/0086754 | A1 | 5/2004 | Lazaroff et al. |
| 2004/0106029 | A1* | 6/2004 | Iqbal et al. ............... 429/27 |
| 2004/0129313 | A1* | 7/2004 | Aharonov et al. ......... 137/375 |
| 2004/0131918 | A1* | 7/2004 | Ohara et al. ............... 429/38 |
| 2005/0100771 | A1* | 5/2005 | Vyas et al. ................. 429/32 |
| 2005/0233203 | A1* | 10/2005 | Hampden-Smith et al. .... 429/44 |
| 2006/0040832 | A1* | 2/2006 | Zhang et al. ............... 508/113 |
| 2007/0015029 | A1* | 1/2007 | Budinski et al. ............ 429/34 |
| 2007/0037040 | A1* | 2/2007 | Koyama et al. ............ 429/44 |

FOREIGN PATENT DOCUMENTS

| | | | |
|---|---|---|---|
| EP | 1369528 | A1 | 12/2003 |
| GB | 2331998 | A | 6/1999 |
| WO | 01/28019 | A2 | 4/2001 |

OTHER PUBLICATIONS

7th International Conference on Modification of Materials with Particle Beams and Plasma Flows, 2004, 3 pages.

T. Le Huu et al, Transformation of sp3 to sp2 Sites of Diamond Like Carbon Coatings During Friction in Vacuum and Under Water Vapour Environment, Thin Solid Films 290-291 (1996) pp. 126-130.

Ramanrxn Systems, Raman Spectroscopy—An Overview, Raman Products Technical Note, No. 1101, 2 pages.

N. Savvides et al, Diamondlike Amorphous Carbon Films Prepared by Magnetron Sputtering of Graphite, Journal of Vacuum Science & Technology A: Vacuum, Surfaces, Films, Abstract, vol. 3, Issue 6, 2 pages.

* cited by examiner

NON-NOBLE METAL INEXPENSIVE CONDUCTIVE COATINGS FOR FUEL CELL BIPOLAR PLATES

TECHNICAL FIELD

The field to which the disclosure generally relates includes bipolar plates, products made therefrom, and methods of making and using the same.

BACKGROUND

Fuel cell stacks have been known to include bipolar plates to collect and distribute electrons between fuel cells. The bipolar plates may be made from composite materials or metal substrates that have been machined or from relatively thin metal substrates that may be stamped to provide reactant gas flow fields and coolant fluid flow fields. Such metal bipolar plates may be coated or uncoated.

Metal bipolar plates are subject to corrosion during the operation of the fuel cell, mainly because of the fluoride ions released as a result of membrane degradation. For example, metal dissolution of anode plates can result in the release of Fe, Cr, Ni ions which may impair proton conductivity of the fuel cell membrane. Cathode bipolar plates are often covered with a thin passivation oxide. However, such oxide creates a surface with high electrical contact resistance.

Protective coatings such as Ti, Ta, Cr and the like have been used for non-precious metal corrosion protection. These metals/alloys maintain corrosion resistance because of the development of protective passive oxide layers on their surfaces. Again, these passive oxides are generally non-conductive and therefore produce a high electrical contact resistance surface. Some of these metals/alloys may also undergo localized corrosion under specific fuel cell operation conditions. Precious noble metal coatings have been utilized as solutions to these problems but such coatings are prohibitively expensive for commercial applications.

For water management, it is desirable for metal bipolar plates to have a low contact angle at the bipolar plate/water border, that is, a contact angle less than 40°. However, the contact angles for precious metal/water interface are typically larger than 40°. Titanium nitride coatings have been proposed as a corrosion-resistant plating for bipolar plates. Although titanium nitride coatings are cost-effective, such coatings do not provide satisfactory protection for the bipolar plate material. Further, titanium nitride coatings develop relatively low water affinity with a contact angle close to 60°.

SUMMARY OF EXEMPLARY EMBODIMENTS OF THE INVENTION

One embodiment of the invention includes a process including providing an electrically conductive component having a first face, and depositing a graphitic/conductive carbon film on the first face of the electrically conductive fuel cell component comprising sputtering a graphite target using a closed field unbalanced magnetron field.

Other exemplary embodiments of the present invention will become apparent from the detailed description provided hereinafter. It should be understood that the detailed description and specific examples, while indicating the exemplary embodiment of the invention, are intended for purposes of illustration only and are not intended to limit the scope of the invention.

BRIEF DESCRIPTION OF THE DRAWINGS

Exemplary embodiments of the present invention will become more fully understood from the detailed description and the accompanying drawings.

DETAILED DESCRIPTION OF EXEMPLARY EMBODIMENTS

The following description of the embodiment(s) is merely exemplary in nature and is in no way intended to limit the invention, its application, or uses.

Figure 1:
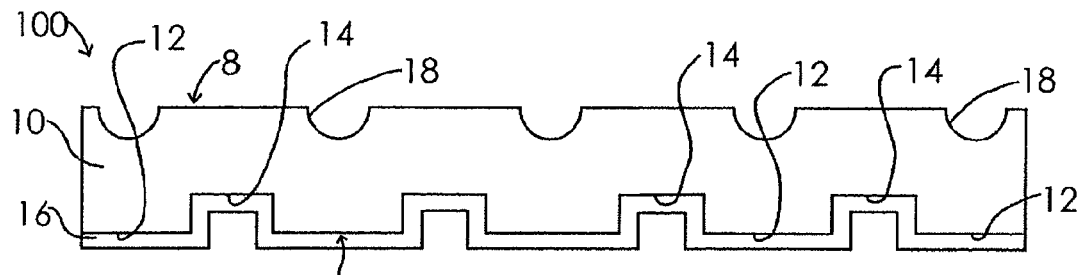
FIG. 1 illustrates a product including a bipolar plate having a graphitic/conductive carbon film deposited thereon, according to one embodiment of the invention.

Referring now to FIG. 1, one embodiment of the invention includes a fuel cell component 100 including a bipolar plate 10 having a first face 6 and an opposite second face 8. The first face 6 includes a plurality of lands 12 and channels 14 defined therein to allow fuel cell reactant gases to flow through the channels 14 of the bipolar plate. The second face 8 of the bipolar plate 10 may include a plurality of cooling fluid channels 18 defined therein. The lands 12, reactant gas channels 14 or cooling fluid channels 18 may be formed in a substrate by machining, etching or stamping or the like. A graphitic/conductive carbon film 16 is deposited over at least portions of the first face 6 of the bipolar plate 10. In the embodiment shown in FIG. 1, the graphitic/conductive carbon film 18 is deposited over the lands 12 and the surface forming the channels 14 of the first face 6. The term "graphitic film" as used herein means a film that includes, resembles, or is derived from graphite. The graphitic film is produced by sputtering graphite targets. The graphite film may include non-crystalline electrically conductive carbon. In one embodiment of the invention, the graphite film is amorphous and wherein Raman spectroscopy of the film indicates the presence of more $sp^2$ carbon bonding than $sp^3$.

In one embodiment of the invention, graphite targets are sputtered in a chamber under the influence of a closed field unbalanced magnetron field. The two graphite targets are placed on strong magnetrons that may be sputtered at a current ranging from 5A-10A in a closed field magnetron arrangement. The pressure in the sputter chamber may range from $1\times10^{-6}$ to $1\times10^{-2}$ Torr, a bias voltage of $-400V$ to $-20V$, pulse width of 250 nanosecond to 2000 nanosecond, and pulse DC at frequency rate of 400 KHz to 50 KHz, and argon flow rate of 200 sccm to 20 sccm for a time period of 10 minutes to 500 minutes. The film may be deposited in a thickness ranging from 5 nm to 1000 nm, or 10 nm to 50 nm. Measurements conducted on bipolar plates including the graphitic/conductive carbon film indicated that the graphitic/conductive carbon film had a low contact resistance, see FIG. 9, and that such films could be used in PEM single fuel cells or stacks, see FIG. 10.

In another embodiment, sputtering chamber includes at least two gases, such as, but not limited to, argon and $H_2$. The flow rate of Ar may range from 20 to 150 sccm and H2 gas flow from 5 to 100 sccm. For example, in one embodiment two gases, $Ar+H_2$, are used with a flow rate in range of 30 sccm, wherein Ar flow was kept at 20 sccm and H2 flow was kept at 10 sccm. Films produce using a two gas method had improved electrical conductivity.

Figure 2:
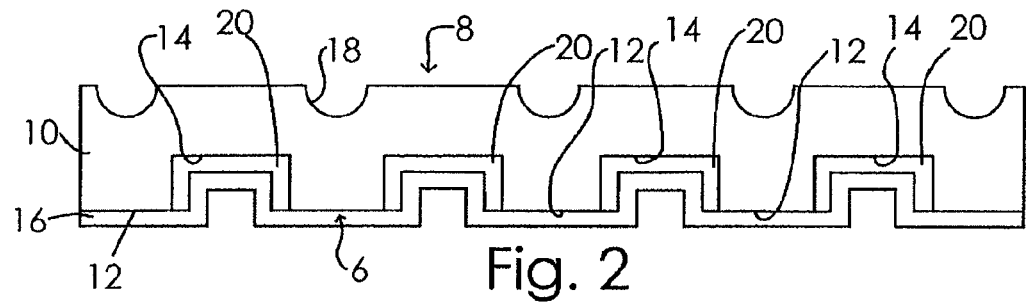
FIG. 2 illustrates a method of making a product including selectively depositing a masking material over portions of a face of a bipolar plate and depositing a graphitic/conductive carbon film over the exposed portions of the bipolar plate and the masking material, according to one embodiment of the invention.
Figure 3:
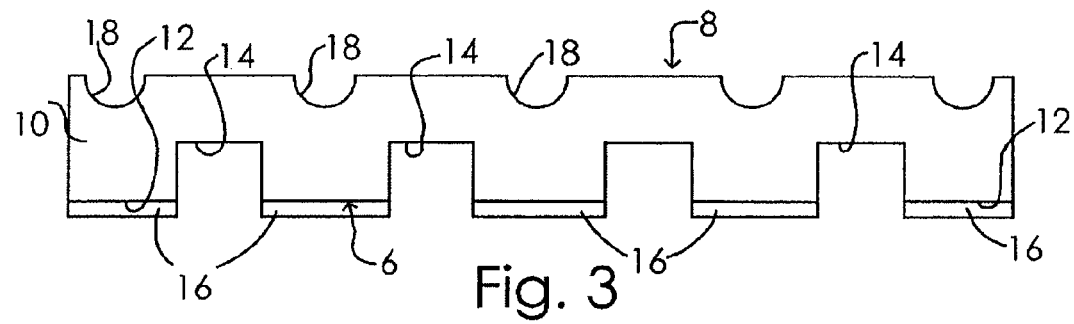
FIG. 3 illustrates a method including removing the mask shown in FIG. 2 so that the graphitic/conductive carbon film remains on selected portions of the face of the bipolar plate, according to one embodiment of the invention.

Referring now to FIG. 2, one embodiment of the invention includes a process including providing a bipolar plate 10 having a first face 6 including a plurality of lands 12 and channels 14 formed therein and depositing a masking material 20, leaving the lands 12 exposed. The masking material may be deposited using photolithographic techniques, screen printing or the like to selectively deposit the masking material 20. Alternatively, a hard mask 20 may be used, such as a metal sheet with openings to expose the lands 12. Thereafter, a graphitic/conductive carbon film 16 is deposited over the exposed lands 12 and over the masking material 20 in the channels 14 by sputtering graphite targets as described above. Thereafter, the masking material 20 may be removed, leaving the graphitic/conductive carbon film 16 only on the lands 12 as shown in FIG. 3.

Figure 4:
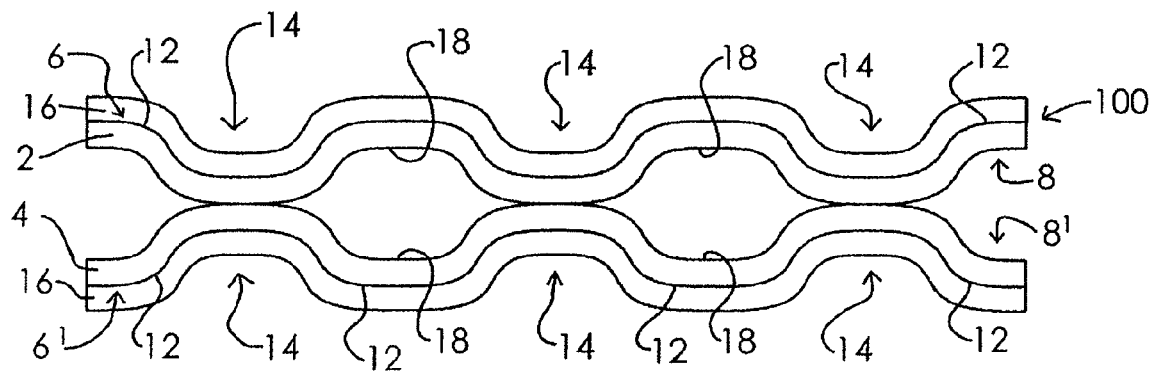
FIG. 4 illustrates a product including a bipolar plate having first and second faces each having a graphitic/conductive carbon film deposited thereon, according to one embodiment of the invention.

Referring now to FIG. 4, another embodiment of the invention includes a bipolar plate including a first thin metal sheet 2 and a second thin metal sheet 4 which each have been stamped or formed to provide a plurality of lands 12 and channels 14 in first and second faces 6, $6^1$ respectively. Cooling channels 18 may be provided in second faces 8, $8^1$ respectively, of the first metal sheet 2 and the second metal sheet 4. The graphitic/conductive carbon films 16 may be deposited over the entire surface of the first faces 6, $6^1$ or may be selectively deposited over portions of the first faces 6, $6^1$. For example, the graphitic/conductive carbon film 16 may be selectively deposited only on the lands 12 of the first metal sheet 2 and the second metal sheet 4.

Figure 5:
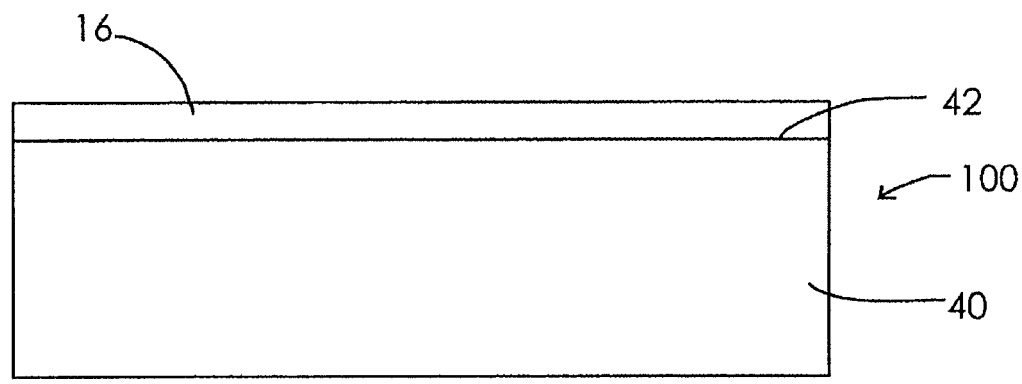
FIG. 5 illustrates a product including a gas diffusion media with a graphitic/conductive carbon film deposited thereon, according to one embodiment of the invention.

Referring now to FIG. 5, one embodiment of the invention includes a product 100 including a gas diffusion media layer 40 having a first face 42 and a graphitic/conductive carbon film 16 which has been sputtered onto the first face 42 as described above. Alternatively, the graphitic/conductive carbon film 16 may be selectively sputtered onto at least portions of the first face 42 of the gas diffusion media layer 40.

Figure 6:
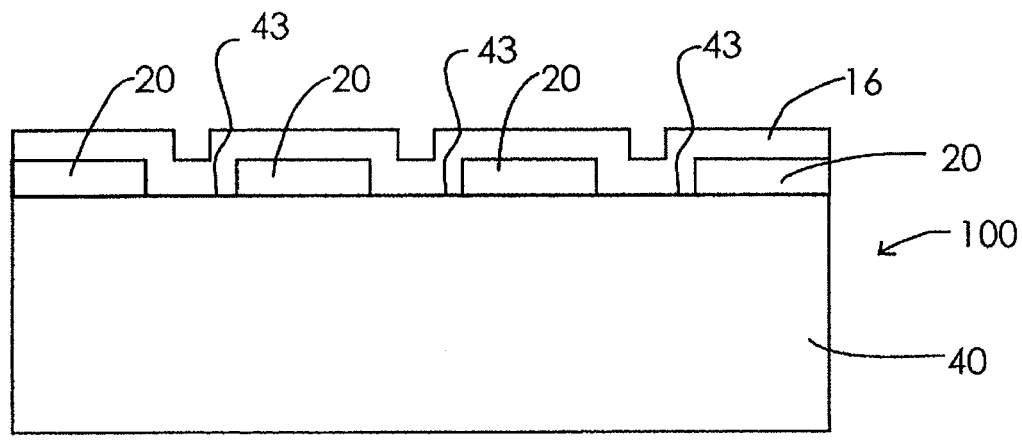
FIG. 6 illustrates a process including selectively depositing a masking material over a face of a gas diffusion media layer and thereafter depositing a graphitic/conductive carbon film over the masking material and the exposed portions of the gas diffusion media layer, according to one embodiment of the invention.
Figure 7:
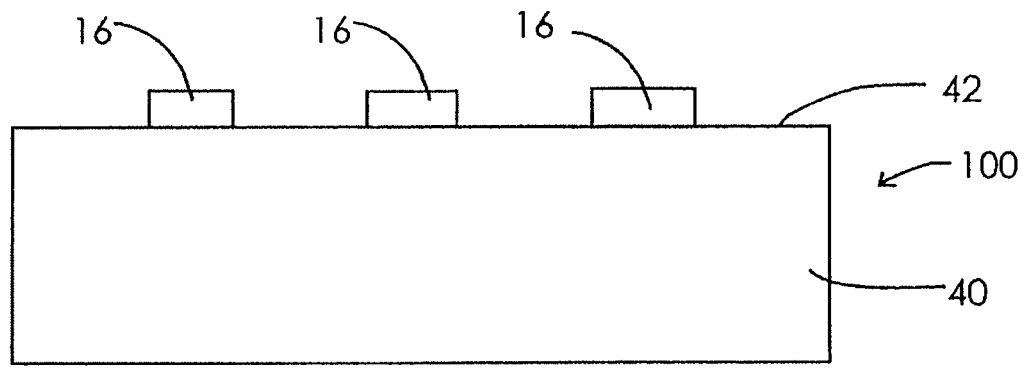
FIG. 7 illustrates a process including removing the masking material shown in FIG. 6, leaving a graphitic/conductive carbon film selectively deposited over portions of the gas diffusion media, according to one embodiment of the invention.

Referring now to FIG. 6, in another embodiment of the invention, a masking material 20 may be selectively deposited on the first face 42 of the gas diffusion media layer 40, leaving portions exposed and not covered by the masking material 20. Thereafter, the graphitic/conductive carbon film 16 may be deposited over the masking material 20 and onto the exposed portions 43 of the first face 42 of the gas diffusion media layer 40 as shown in FIG. 6. Thereafter, as shown in FIG. 7, the masking material 20 may be removed, leaving the graphitic/conductive carbon film 16 selectively deposited over the first face 42 in the area of the exposed portion. The position of the selective portions of the graphitic/conductive carbon film 16 deposited on the first face 42 of the gas diffusion media layer 40 may be such that they align with and run generally parallel to the lands 12 of the bipolar plate 10.

Figure 8:
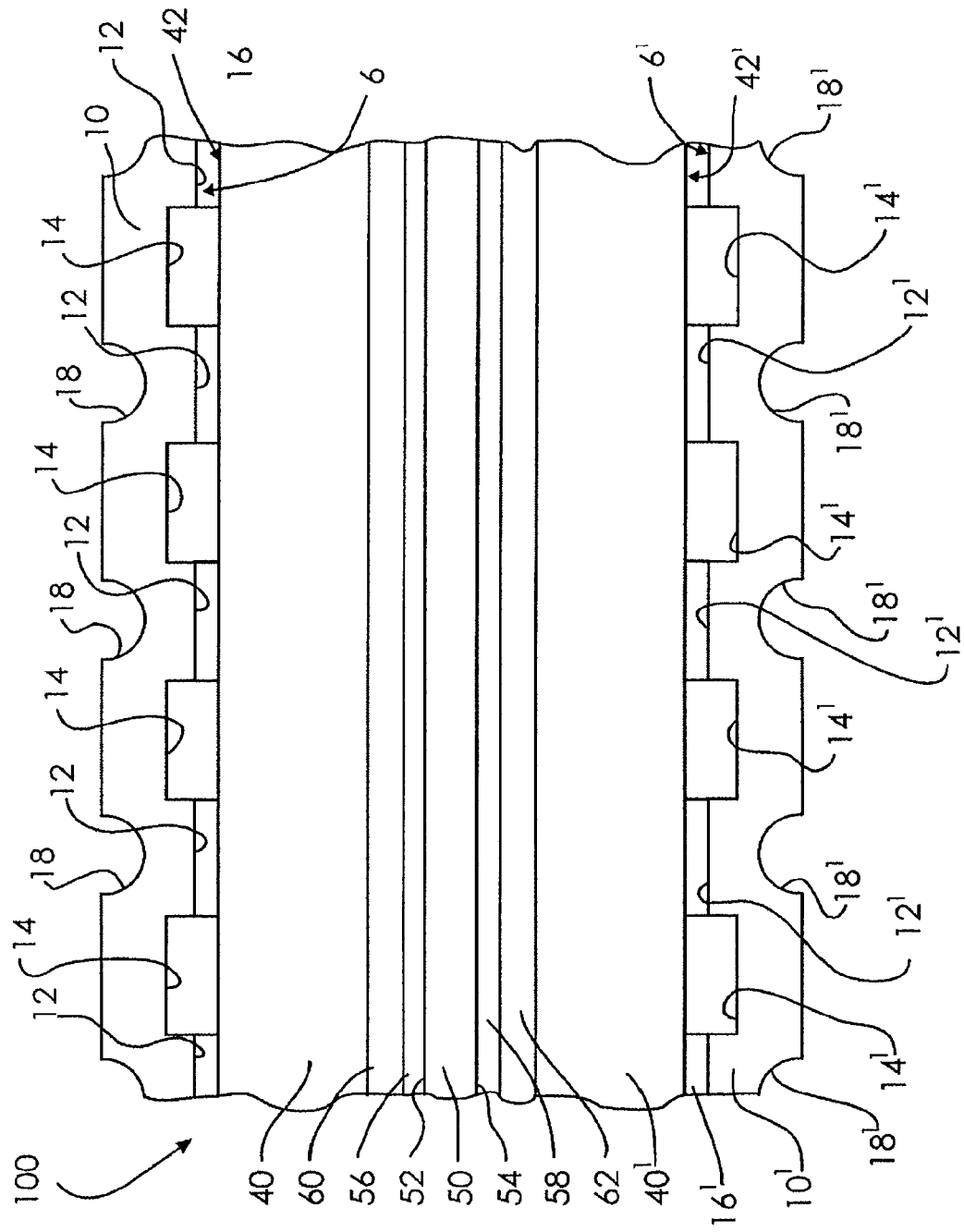
FIG. 8 illustrates a product including a graphitic/conductive carbon film interposed between a bipolar plate and the gas diffusion media layer, according to one embodiment of the invention.

Referring now to FIG. 8, another embodiment of the invention includes a product 100 including a solid polymer electrolyte membrane 50 having a first face 52 and an opposite second face 54. An anode 56 is provided over the first face 52 of the solid polymer electrolyte membrane 50. A first gas diffusion media layer 40 may be provided over the anode 56, and optionally a first microporous layer 60 may be interposed between the first gas diffusion media layer 40 and the anode 56. A first bipolar plate 10 having a plurality of lands 12 and channels 14 formed in a first face thereof is provided over the first gas diffusion media layer 40. A graphitic/conductive carbon film 16 is interposed between the first gas diffusion media layer 40 and the first face 6 of the first bipolar plate 10. The graphitic/conductive carbon film 16 may cover the entire first face 42 of the gas diffusion media layer 40 or the graphitic/conductive carbon film 16 may cover the entire first face 6 of the bipolar plate. Optionally, as shown in FIG. 8, the graphitic/conductive carbon film may be selectively deposited on portions of the first face 6 of the bipolar plate 10 or selectively deposited on portions of the first face 42 of the gas diffusion media layer 40. A cathode 58 may underline the second face 54 of the solid polymer electrolyte membrane 50. A second gas diffusion media layer $40^1$ may underline the cathode layer 58, and optionally a second microporous layer 62 may be interposed between the second gas diffusion Media layer $40^1$ and the cathode 58. A second bipolar plate $10^1$ is provided and includes a plurality of lands $12^1$ and channels $14^1$ formed in a first face $6^1$ thereof. A second graphitic/conductive carbon film $16^1$ is interposed between the first face $6^1$ of the second bipolar plate $10^1$ and the second gas diffusion media layer $40^1$. The second graphitic/conductive carbon film may be sputtered onto the first face $42^1$ of the second gas diffusion media layer $40^1$ or on the first face $6^1$ of the second bipolar plate $10^1$.

In another embodiment, after the graphitic/conductive carbon coatings are sputter deposited, the coatings were post treated by a post-treatment process to introduce polar functional moieties, (predominantly hydroxyl groups, amine and sulfur polar groups) onto the base graphitic/conductive carbon structure, thereby enhancing the material hydrophilicity.

In one embodiment of the invention, the post treatment is done by exposing the graphitic/conductive carbon films to a reactive oxygen plasma which would activate the graphitic/conductive carbon coatings by breaking bonds and forming hydroxyl, carboxyl and aldehyde functional groups. This activation by post-treatment also enhances the material porosity, which may further enhance the material hydrophilicity.

In one embodiment of the invention, the post treatment is done by exposing the graphitic/conductive carbon coating films to a reactive gases, such as, nitrogen, nitrous oxide, nitrogen dioxide, ammonia or mixture thereof which would activate the graphitic/conductive carbon coatings coating by breaking bonds and forming nitrogen based derivates like amines, amide, diazo functional groups. This activation by post-treatment also enhances the material porosity, which may further enhance the material hydrophilicity.

In one embodiment of the invention, the post-treatment is done by exposing the graphitic/conductive carbon coating films to a reactive sulfur based gas like hydrogen sulfide, thereof which would activate the graphitic/conductive carbon coatings by breaking bonds and forming sulfur based derivates like sulfates, sulphites and thiols functional groups. This activation by post-treatment also enhances the material porosity, which may further enhance the material hydrophilicity.

In another embodiment, the coating is reacted with a chemical to produce the polar groups. In another embodiment, the polar groups are introduced by applying a thin layer of a hydrophilic coating.

In one embodiment of the invention, the post-treatment process involves exposure to a pulsed DC reactive plasma environment for 0 to 10 minutes, preferably: 0.5 to 3 minutes, and most preferably: 2 minutes.

Figure 9:
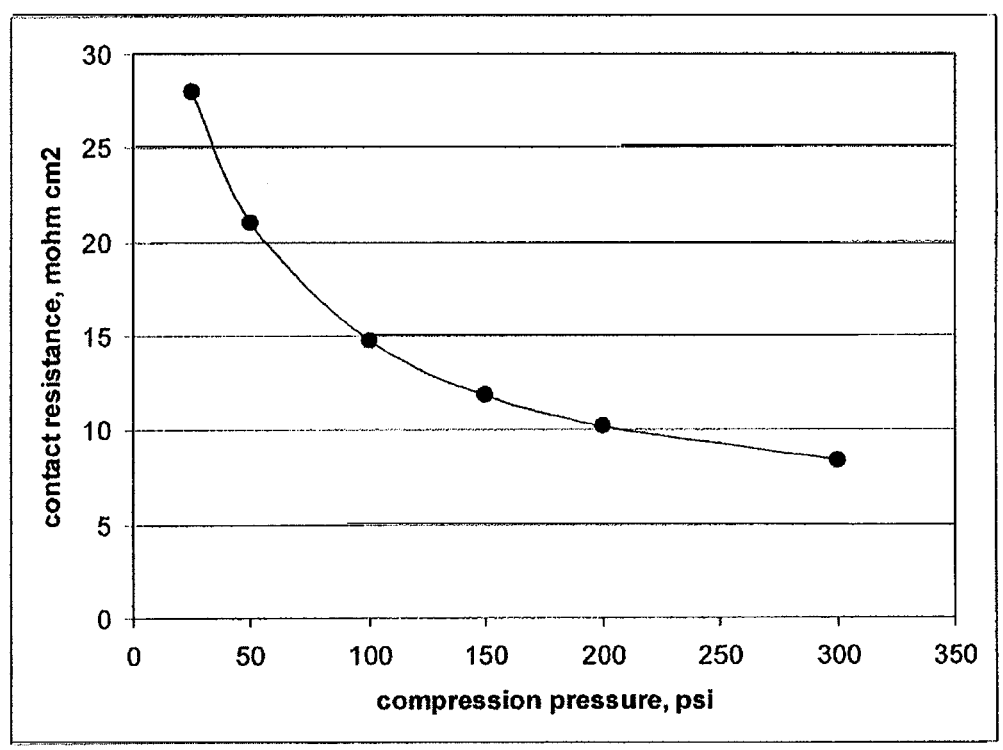
FIG. 9 is a graph of the contact resistance measured paper to paper obtained on 304L stainless steel coupon with sputtered carbon coatings according to one embodiment of the invention.

Referring now to FIG. 9, values of the contact resistance were "measured paper to paper" obtained on a 304L stainless steel coupon coated with the sputtered carbon coatings and plotted as FIG. 9. Electrical contact resistance of the films are measured by using compressive forces of 25 to 300 psi using an Instron equipment. The samples were sandwiched between two diffusion mediums (Toray T100) and constant current of 1 A/cm2 was applied and a voltage drop was measured across the two Diffusion Medium.

Figure 10:
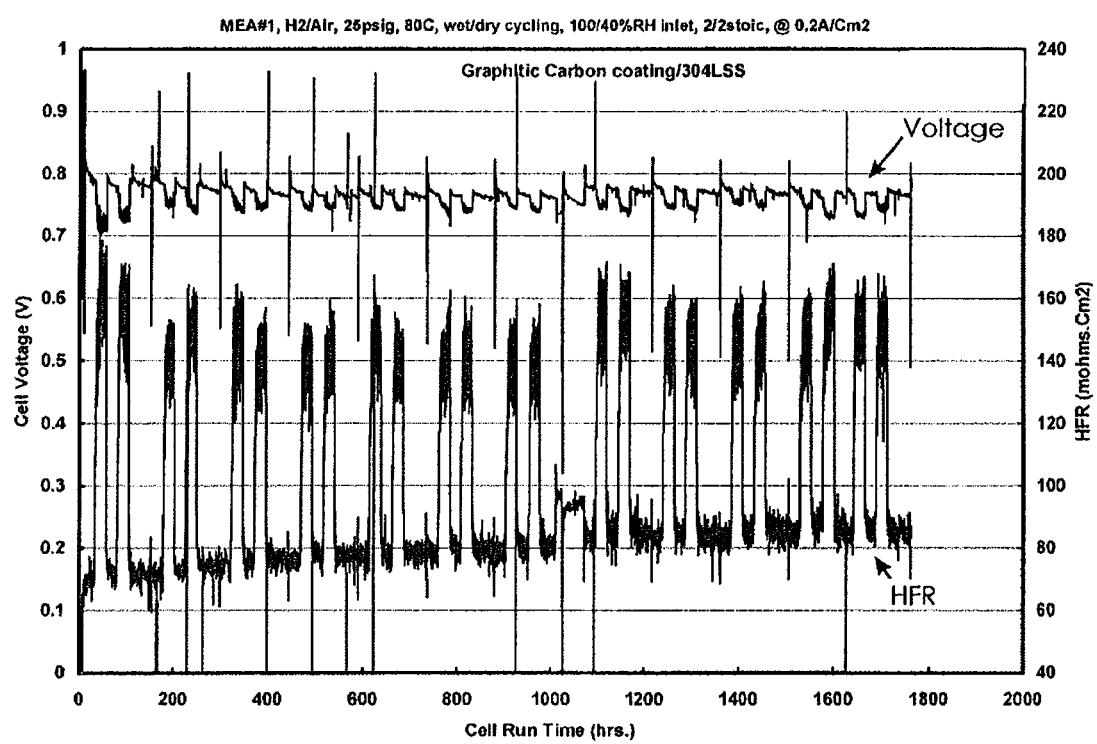
FIG. 10 is a graph of single cell durability data obtained on graphite/conductive carbon coating on 304L stainless steel coupon using an MEA.

FIG. 10, shows the single fuel cell durability data obtained on the graphitic/conductive carbon coating on 304L stainless steel using a MEA in conditions as follow: Cell operated with H2/Air at 25 psig at 80° C. and relative humidity was cycled between 100% to 40% for 24 hours each. The gas stoics for both H2/Air was kept constant at 2/2 stoic. The cell was operated at constant current density of 0.2 A/cm2. The above graph shows that cell voltage did not show change with time over 1800 hours of testing and the Cell resistance was maintained during the run time.

When the terms "over", "overlying", "overlies", or "under", "underlying", "underlies" are used with respect to the relative position of a first component or layer with respect to a second component or layer, such shall mean that the first component or layer is in direct contact with the second component or layer, or that additional layers or components are interposed between the first component or layer and the second component or layer.

The above description of embodiments of the invention is merely exemplary in nature and, thus, variations thereof are not to be regarded as a departure from the spirit and scope of the invention.

What is claimed is:

1. A process comprising:
   providing an electrically conductive fuel cell bipolar plate having a first face;
   depositing a graphitic/conductive carbon film on the first face of the electrically conductive fuel cell bipolar plate comprising sputtering a graphite target using a closed field unbalanced magnetron field; and
   exposing the graphitic/conductive carbon film to at least one of reactive oxygen plasma, reactive nitrogen gases, or reactive sulfur gases to make the graphitic/conductive carbon film more hydrophilic by introducing polar functional groups onto the graphitic/conductive carbon film and enhancing the porosity of the graphitic/conductive carbon film.

2. A process as set forth in claim 1 wherein the first face includes a plurality of lands and channels.

3. A process as set forth in claim 2 wherein the graphitic/conductive carbon film is deposited only on the lands of the first face.

4. A process as set forth in claim 2 wherein the bipolar plate is constructed from stainless steel.

5. A process as set forth in claim 4 wherein the stainless steel is one of 201LN, 304L, 316L, 317L, or 904L.

6. A process as set forth in claim 2 wherein post-treating the graphitic/conductive carbon film comprises exposing the film to a pulsed DC reactive plasma environment for a period of time up to 10 minutes.

7. A process as set forth in claim 1 wherein the sputtering is conducted using a current ranging from 5A-10A.

8. A process as set forth in claim 1 wherein the sputtering is conducted in a sputtering chamber under a pressure ranging from $1\times10^{-6}$ to $1\times10^{-2}$ Torr.

9. A process as set forth in claim 1 wherein the sputtering is conducted in a sputtering chamber and further comprising flowing an inert gas into the chamber at a flow rate of 200 sccm to 20 sccm.

10. A process as set forth in claim 1 wherein the sputtering is conducted in a sputtering chamber and further comprising flowing at least two gases into the chamber, wherein the combined flow rate of the two gases ranges 200 sccm to 20 sccm.

11. A process as set forth in claim 10 wherein the two gases are argon and $H_2$.

12. A process as set forth in claim 1 wherein the sputtering is conducted in a sputtering chamber and further comprising flowing argon and hydrogen into the chamber, wherein the combined flow rate of the two gases ranges 200 sccm to 20 sccm, and wherein the flow rate of hydrogen is approximately one-half the flow rate of argon.

13. A process as set forth in claim 1 wherein the sputtering is conducted in a sputtering chamber and further comprising flowing argon into the chamber at a rate of 20-150 sccm, and flowing $H_2$ into the chamber at a rate of 5-100 sccm.

14. A process as set forth in claim 1 wherein the sputtering is conducted using a bias voltage of −400V to −20V.

15. A process as set forth in claim 1 wherein the sputtering is conducted over a time period ranging from 10 minute to 500 minutes.

16. A process as set forth in claim 1 wherein the sputtering is conducted using a bias voltage ranging from −400V to −20V, a pulse width ranging from 250 nanoseconds to 2000 nanoseconds and a pulse DC frequency rate ranging from 400 KHz to 50 KHz.

17. A process as set forth in claim 1 wherein the graphitic/conductive carbon film comprises non-crystalline electrically conductive carbon.

18. A process as set forth in claim 1 wherein the electrically conductive fuel cell component is a bipolar plate comprising stainless steel, and wherein the graphitic/conductive carbon film comprises non-crystalline electrically conductive carbon.

19. A process as set forth in claim 1 wherein the graphitic/conductive carbon film is deposited to a thickness ranging from 10 nm to 500 nm.

20. A process as set forth in claim 1 wherein the graphitic/conductive carbon film has a water contact angle less than 40°.

21. A process as set forth in claim 1 wherein the graphitic/conductive carbon film has a contact resistance of less than 20 mohm cm2 at a compression pressure of 200 psi or higher.

22. A process as set forth in claim 1 wherein the graphitic/conductive carbon film consists essentially of non-crystalline electrically conductive carbon.

23. A process as set forth in claim 1 wherein post-treating the graphitic/conductive carbon film introduces at least one of hydroxyl, amine or sulfur polar groups.

24. A process as set forth in claim 1 wherein exposing the graphitic/conductive carbon film to reactive oxygen plasma introduces at least one of a hydroxyl, carboxyl or aldehyde functional group onto the graphitic/conductive carbon film.

25. A process as set forth in claim 1 wherein exposing the graphitic/conductive carbon film to reactive nitrogen gases introduces at least one of an amine, amide or diazo functional group onto the graphitic/conductive carbon film.

26. A process as set forth in claim 25 wherein the reactive nitrogen gas comprises at least one of nitrogen, nitrous oxide, nitrogen dioxide, ammonium or mixtures thereof.

27. A process as set forth in claim 1 wherein exposing the graphitic/conductive carbon film to reactive sulfur gases introduces at least one of a sulfate, sulphide or thiol functional group onto the graphitic/conductive carbon film.

28. A process as set forth in claim 1 wherein the exposing the graphitic/conductive carbon film is conducted to activate the graphitic/conductive carbon film breaking bonds thereof and forming hydroxyl, carboxyl or aldehyde functional groups.

29. A process comprising:
   providing a metal substrate having a first metal face and an opposed second face;
   forming a plurality of lands and channels in the first face of the metal substrate;
   sputtering a graphitic/conductive carbon film that consists essentially of non-crystalline electrically conductive carbon directly on the first metal face of the metal substrate, to a thickness ranging from 10 nm to 500 nm, from a graphite target using a closed field unbalanced magnetron field; and
   post-treating the graphitic/conductive carbon film to introduce polar functional groups onto the graphitic/conductive carbon film to make the graphitic/conductive carbon film more hydrophilic and enhancing the porosity of the graphite/conductive carbon film.

30. A process as set forth in claim 29 wherein post-treating the graphitic/conductive carbon film comprises applying a thin layer of material including polar functional groups to provide a hydrophilic coating.

31. A process as set forth in claim 29 wherein post-treating the graphitic/conductive carbon film comprises exposing the graphitic/conductive carbon film to a pulsed DC reactive plasma environment for a period of time up to 10 minutes.

32. A process as set forth in claim 31 wherein post-treating the graphitic/conductive carbon film comprises exposing the graphitic/conductive carbon film to a pulsed DC reactive plasma for a period of time ranging from 0.5 to 3 minutes.

33. A process as set forth in claim 29 wherein depositing the graphitic/conductive carbon film comprises sputtering a graphite target using a closed field unbalanced magnetron field in a sputter chamber, and wherein the sputtering is conducted using a bias voltage ranging from −400V to −20V, a pulse width ranging from 250 nanoseconds to 2000 nanoseconds and a pulse DC frequency rate ranging from 400 KHz to 50 KHz.

34. A process as set forth in claim 29 wherein post-treating the graphitic/conductive carbon film comprises exposing the graphitic/conductive carbon film to at least one of reactive oxygen plasma, reactive nitrogen gases, or reactive sulfur gases to introduce the polar functional groups onto the graphitic/conductive carbon film and to enhance the porosity of the graphitic/conductive carbon film.

35. A process as set forth in claim 29 wherein the graphitic/conductive carbon film is deposited only on the lands of the first metal face.

* * * * *